(12) United States Patent
Hirooka et al.

(10) Patent No.: US 8,438,660 B2
(45) Date of Patent: May 7, 2013

(54) MICRO CONTACT PROBER

(75) Inventors: Motoyuki Hirooka, Kumagaya (JP);
Makoto Okai, Tokorozawa (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/378,286

(22) PCT Filed: May 26, 2010

(86) PCT No.: PCT/JP2010/003504
§ 371 (c)(1),
(2), (4) Date: Dec. 14, 2011

(87) PCT Pub. No.: WO2010/146773
PCT Pub. Date: Dec. 23, 2010

(65) Prior Publication Data
US 2012/0090056 A1    Apr. 12, 2012

(30) Foreign Application Priority Data
Jun. 15, 2009  (JP) .................................. 2009-141784

(51) Int. Cl.
*G01Q 30/02* (2010.01)
(52) U.S. Cl.
USPC .......................... 850/9; 850/1; 850/8; 850/55
(58) Field of Classification Search .................. 850/1, 8, 850/9, 55
See application file for complete search history.

(56) References Cited

U.S. PATENT DOCUMENTS 6,006,593 A * 12/1999 Yamanaka ...................... 73/105

| 6,636,050 B2 | 10/2003 | Nakayama et al. |
| 8,040,146 B2 * | 10/2011 | Sunaoshi et al. ......... 324/750.12 |
| 2002/0084790 A1 | 7/2002 | Nakayama et al. |
| 2007/0012095 A1 | 1/2007 | Suzuki |
| 2007/0051887 A1 | 3/2007 | Hidaka et al. |
| 2007/0131249 A1 | 6/2007 | Nakaue |

(Continued)

FOREIGN PATENT DOCUMENTS

| JP | 2002-31655 | 1/2002 |
| JP | 2002-310883 | 10/2002 |

(Continued)

OTHER PUBLICATIONS

S. Yoshimoto, et al., Japanese Journal of Applied Physics vol. 44, No. 51, 2005, pp. L1563-L1566.

(Continued)

*Primary Examiner* — Michael Logie
(74) *Attorney, Agent, or Firm* — Brundidge & Stanger, P.C.

(57) ABSTRACT

The stress due to contact between a probe and a measurement sample is improved when using a microcontact prober having a conductive nanotube, nanowire, or nanopillar probe, the insulating layer at the contact interface is removed, thereby the contact resistance is reduced, and the performance of semiconductor device examination is improved. The microcontact prober comprises a cantilever probe in which each cantilever is provided with a nanowire, nanopillar, or a metal-coated carbon nanotube probe projecting by 50 to 100 nm from a holder provided at the fore end and a vibrating mechanism for vibrating the cantilever horizontally with respect to the subject. The fore end of the holder may project from the free end of the cantilever, and the fore end of the holder can be checked from above the cantilever.

7 Claims, 12 Drawing Sheets

U.S. PATENT DOCUMENTS

| | | |
|---|---|---|
| 2007/0164214 A1 | 7/2007 | Choi |
| 2008/0000293 A1 | 1/2008 | Kitazawa et al. |
| 2008/0257024 A1* | 10/2008 | Watanabe et al. ............... 73/105 |
| 2009/0009203 A1* | 1/2009 | Sunaoshi et al. .............. 324/760 |

FOREIGN PATENT DOCUMENTS

| | | |
|---|---|---|
| JP | 2004-93574 | 3/2004 |
| JP | 2004/354359 | 12/2004 |
| JP | 3638865 | 1/2005 |
| JP | 2005-308675 | 11/2005 |
| JP | 2006-267027 | 10/2006 |
| JP | 2006-267113 | 10/2006 |
| JP | 2007-17388 | 1/2007 |
| JP | 2007-64812 | 3/2007 |
| JP | 2007-71884 | 3/2007 |
| JP | 2007071884 A * | 3/2007 |
| JP | 2007/163144 | 6/2007 |
| JP | 2007-187665 | 7/2007 |

OTHER PUBLICATIONS

International Search Report from International Application PCT/JP2010/003504 mailed Aug. 17, 2010.

* cited by examiner

FIG.10
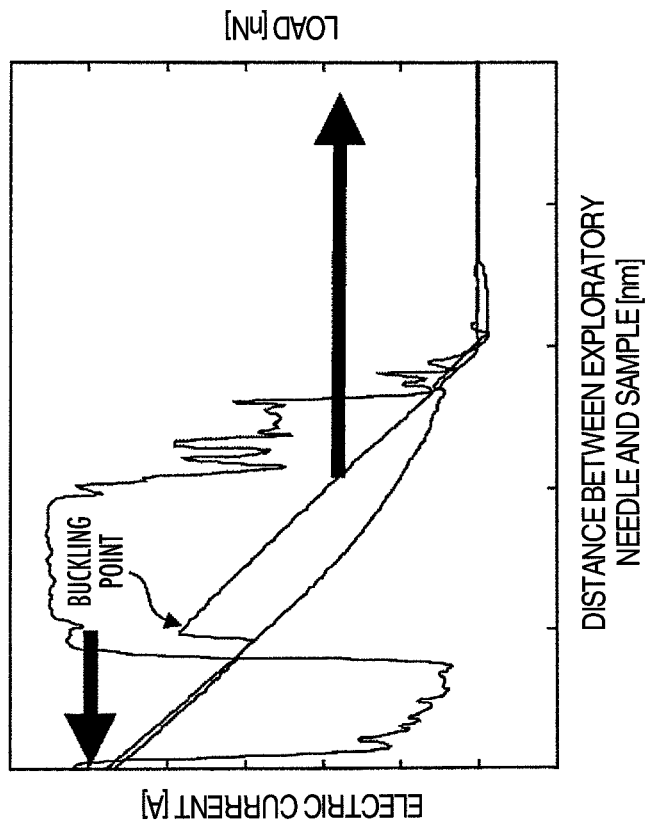
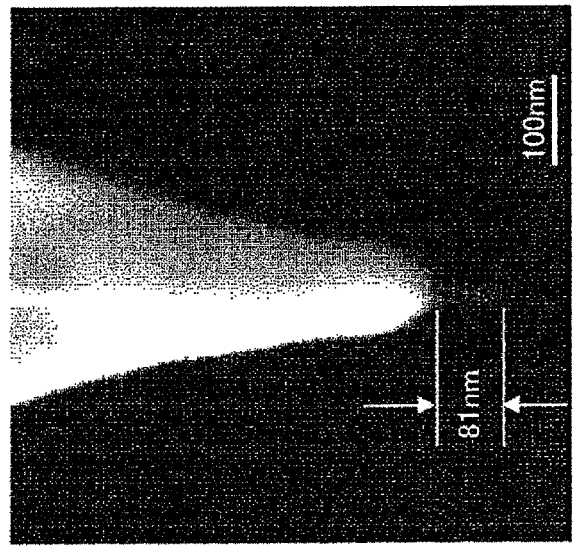

ic contact type prober, for example, using a nano wire, a nano pillar, or a carbon nano tube exploratory needle, and more particularly to an exploratory needle contact mechanism employing a cantilever type probe.

MICRO CONTACT PROBER

TECHNICAL FIELD

The present invention relates to a micro contact type prober, for example, using a nano wire, a nano pillar, or a carbon nano tube exploratory needle, and more particularly to an exploratory needle contact mechanism employing a cantilever type probe.

BACKGROUND ART

In conjunction with a progress of a nanotechnology, the needs of a physical property measurement in a micro region has been enhanced. As a measuring method which can evaluate a structure and a physical property of a material on the basis of a spatial resolving power of nanometer, there can be listed up a measurement of an electric conduction characteristic by a scanning tunneling microscope, an atomic force microscope, a proximity field optical microscope, a transmission electron microscope, a multiple exploratory needle nano probe. In the measurement of the electric conduction characteristic by the multiple exploratory needle nano probe, it is possible to expect such a matter that the information relating to an electron correlation such as a semiconductor device or the like can be obtained, by using four or more exploratory needles.

In a measurement system (hereinafter, refer to as a micro contact type prober) using a multiple exploratory needle nano probe, a short life of the exploratory needle going with a narrow diameter of the exploratory needle and an increase of a contact resistance come into question in future. Particularly, in a failure analysis of a semiconductor device, in order to correspond to a future minute structure of the device, a reservation of a conductivity and an improvement of a mechanical strength in the exploratory needle come to an important factor.

There can be thought that a metal nano wire, a carbon nano tube or the like is applied as the exploratory needle in place of a conventional narrowed metal exploratory needle. For example, in the case of using the carbon nano tube as the exploratory needle, in order to secure a conductivity of the exploratory needle, there is a method of forming a metal film on a surface thereof. In the metal film, it is desirable that it is applied uniformly from a root of the carbon nano tube to a leading end thereof. However, it is not easy to uniformly form the metal film having a good adhesion to a surface of the carbon nano tube.

Under such a background, there have been proposed a method of coating a metal on a surface of a carbon nano tube, and a method of utilizing as a nano probe. As a metal coating method, there is a metal coating method using a pulsed laser deposition (PLD) method, as shown in non-patent document 1. It is a method of irradiating a pulse laser onto a PtIr or W target and depositing a metal on a surface of a carbon nano tube by utilizing a generated plume. It is possible to form a metal film which is extremely thin such as several nm and has a high quality, on the surface of the carbon nano tube in accordance with the PLD method. A resistance value of the exploratory needle can be reduced to 10 kΩ, order in accordance with this method. Further, in patent documents 1 and 2 relating to a prober exploratory needle application of the carbon nano tube, there has been proposed an apparatus which forms a carbon nano tube fixed to a metal exploratory needle in accordance with an electron beam depositing method, cancels a contact resistance on the basis of a four-terminal measurement and measures a micro impedance.

However, in the four-terminal measurement, since a contact resistance value generated with respect to the metal exploratory needle fixing the nano tube, the nano wire or the like, and a resistance value of the nano tube or the nano wire itself becomes higher such as several k to several tens kΩ, there can be thought that it is hard to measure a resistance value of a high resolving power. It is desirable that the contact resistance and the exploratory needle resistance are as low as possible in a substance contact, a wiring and a via resistance measurement, and it is necessary to lower to about 10 Ω, however, in the uniform metal film carbon nano tube exploratory needle disclosed in the patent document 1, since the contact resistance in the leading end is domineering, it has been hard to reduce the resistance to several tens kΩ or less.

The contact resistance coming into question is caused by a small contact stress between the exploratory needle and a measured sample, and an insulating layer such as an oxide film or a contamination of a contact interface.

For example, in the case that the carbon nano tube is set to the exploratory needle, in spite of a very high rigidity such as a Young's modulus of 1 Ta, the carbon nano tube having an aspect ratio equal to or more than 50 is bent sufficiently by a force of several nN. In other words, at a time of applying to the exploratory needle, however the carbon nano tube is pressed, the contact resistance becomes larger since the contact stress is small. Further, since the oxide film and the contamination on the contact interface can be mechanically removed in the conventional metal exploratory needle, however, is bent as mentioned above in the carbon nano tube, a state in which it pinches the oxide film and the contamination is generated, and it is impossible to measure a true resistance value.

PRIOR ART DOCUMENT

Patent Document
   Patent Document 1: JP-B2-3638865
   Patent Document 2: JP-A-2007-64812
Non-Patent Document
   Non-Patent Document 1: Japan Journal of Applied Physics Vol. 44 L1563 (2005)

SUMMARY OF THE INVENTION

Problem to be Solved by the Invention

An object of the present invention is to reduce a contact resistance and improve a performance of a semiconductor device inspection, by improving a contact stress between an exploratory needle and a measured sample in a micro contact type prober mounting a conductive nano exploratory needle thereon and removing an insulating layer on a contact interface.

Means for Solving the Problem

In a micro contact type prober, a cantilever type probe is provided, and cantilevers are provided with a conductive nano exploratory needle which protrudes out of a holder installed in a leading end, and a vibrating mechanism for vibrating each of the cantilevers in a horizontal direction with respect to a subject to be inspected.

The conductive nano exploratory needle is characterized by being constructed by a metal, a nano wire or a nano pillar including a metal, or a carbon nano tube coating a metal, which protrudes at a length between 50 and 100 nm out of a holder.

Further, a leading end portion of the holder may protrudes out of a free end of the cantilever, and it is possible to check out a leading end of the holder from an upper portion of the cantilever. The cantilever is constructed by a metal or a conductive cantilever obtained by coating a metal on a silicon.

In order to detect a contact, a piezoelectric body is provided in the cantilever, thereby detecting an amount of deflection of the cantilever on the basis of an electric signal of the piezoelectric body, or a feedback mechanism of a tunnel current is provided in the prober, thereby detecting a contact between the exploratory needle and the measured sample on the basis of the tunnel current.

Effect of the Invention

In accordance with the present invention, the contact stress between the exploratory needle and the measured sample in the micro contact type prober can be improved by setting the extremely short carbon nano tube or the metal nano wire to the exploratory needle, and employing the cantilever type probe, and the contact resistance can be reduced and the performance of the semiconductor device inspection can be improved by removing the insulating layer on the contact surface by the vibrating mechanism.

BRIEF DESCRIPTION OF THE DRAWINGS

FIG. 10 is a graph showing a load and an electric current at a time of measuring a force curve of a probe using a carbon nano tube in accordance with the present invention;

MODE FOR CARRYING OUT THE INVENTION

Figure 1:
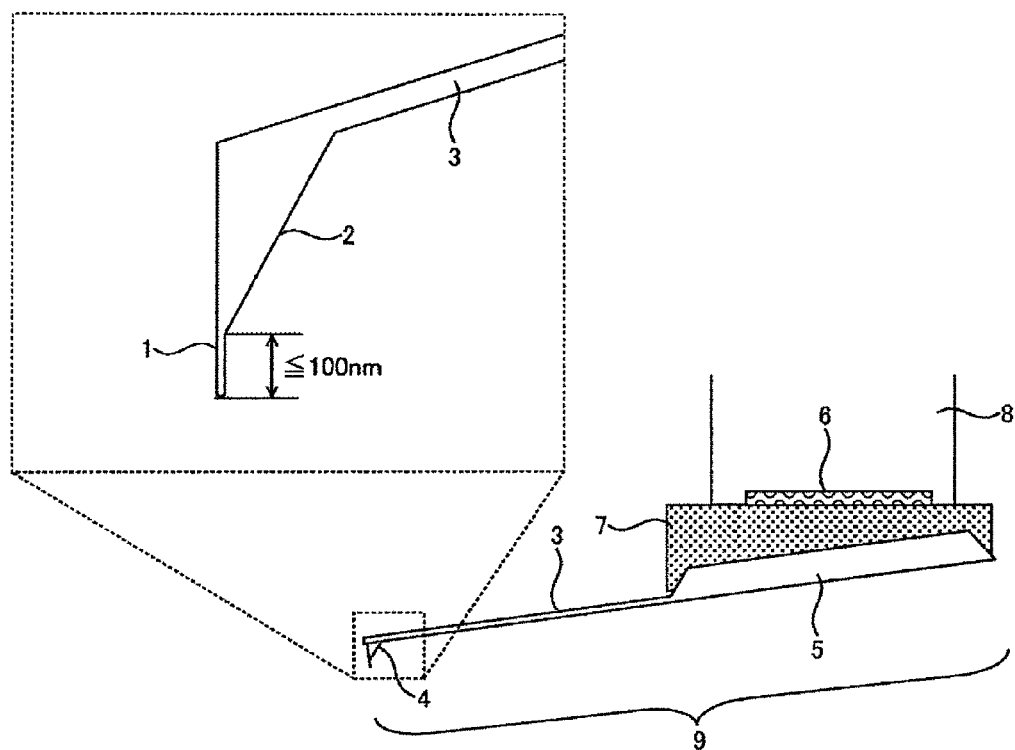
FIG. 1 is a schematic view showing an outline of a probe in accordance with a first embodiment of the present invention.

A description will be given of embodiments in accordance with the present invention with reference to the accompanying drawings. In this case, the present invention is not limited to the embodiments which are picked up here, but may be appropriately combined.

In this case, an overlapping description will be omitted by attaching the same reference numerals to the same corresponding portions in the drawings.

(First Embodiment)

FIG. 1 is a schematic view showing an outline of a probe in a micro contact type prober in accordance with a first embodiment of the present invention. A probe 9 in accordance with the present invention is constructed by a holder 2 which is attached to a leading end of a cantilever 3 protruding out of a substrate 5, and a nano pillar exploratory needle 1 which protrudes out of the holder 2 at a length between 50 and 100 nm and has a diameter between 10 and 20 nm.

The substrate 5, the cantilever 3 and the holder 2 can employ a conductive raw material such as Si, SiN or tungsten obtained by coating a conductive film such as Au, PtIr, Ti/Pt, Ti/Pt/Au or the like.

The cantilever 3 can use a structure in which a spring constant is in a range between 0.1 and 100 N/m, a higher spring constant is selected in the case that it is desired to enlarge a contact stress of the nano exploratory needle so as to reduce the contact resistance as much as possible, and a lower spring constant is selected in the case that it is desired to make the contact stress of the nano exploratory needle small so as to prevent a breakage of the exploratory needle preferably.

Further, the nano pillar exploratory needle 1 is obtained by decomposing a metal gas on the basis of an irradiation of a charged particle beam and depositing a conductive metal in a pillar shape. As a precursor gas used at this time, there are, for example, $W(CO)_6$, $WF_6$, $Me_2Au(tfc)$, $Co_2(CO)_8$, $Cr(C_6H_6)_2$, hfac-Cu-TMVS, $Fe(CO)_5$, $Mo(CO)_6$, $Ni(CO)_4$, $Os_3(CO)_{12}$, $Pd(OOCCH_3)_2$, $Pt(PF_3)_4$ and the like. In order to secure a conductivity of the nano pillar exploratory needle 1, noble metals such as a gold, a platinum, a palladium and the like are preferable, however, it is not particularly limited.

Particularly, in an electron beam induced deposition (EBID) method using an electron microscope, it is possible to form an extremely narrow metal pillar by narrowing down a spot size to 10 nanometer or less and spot irradiating an electron beam 32 in a range of a sample current value between 100 pA and 5000 pA. Further, it is possible to improve a metal purity of the pillar by introducing a water and an oxygen gas into a casing 26 of the electron microscope as occasion demands.

Figure 8:
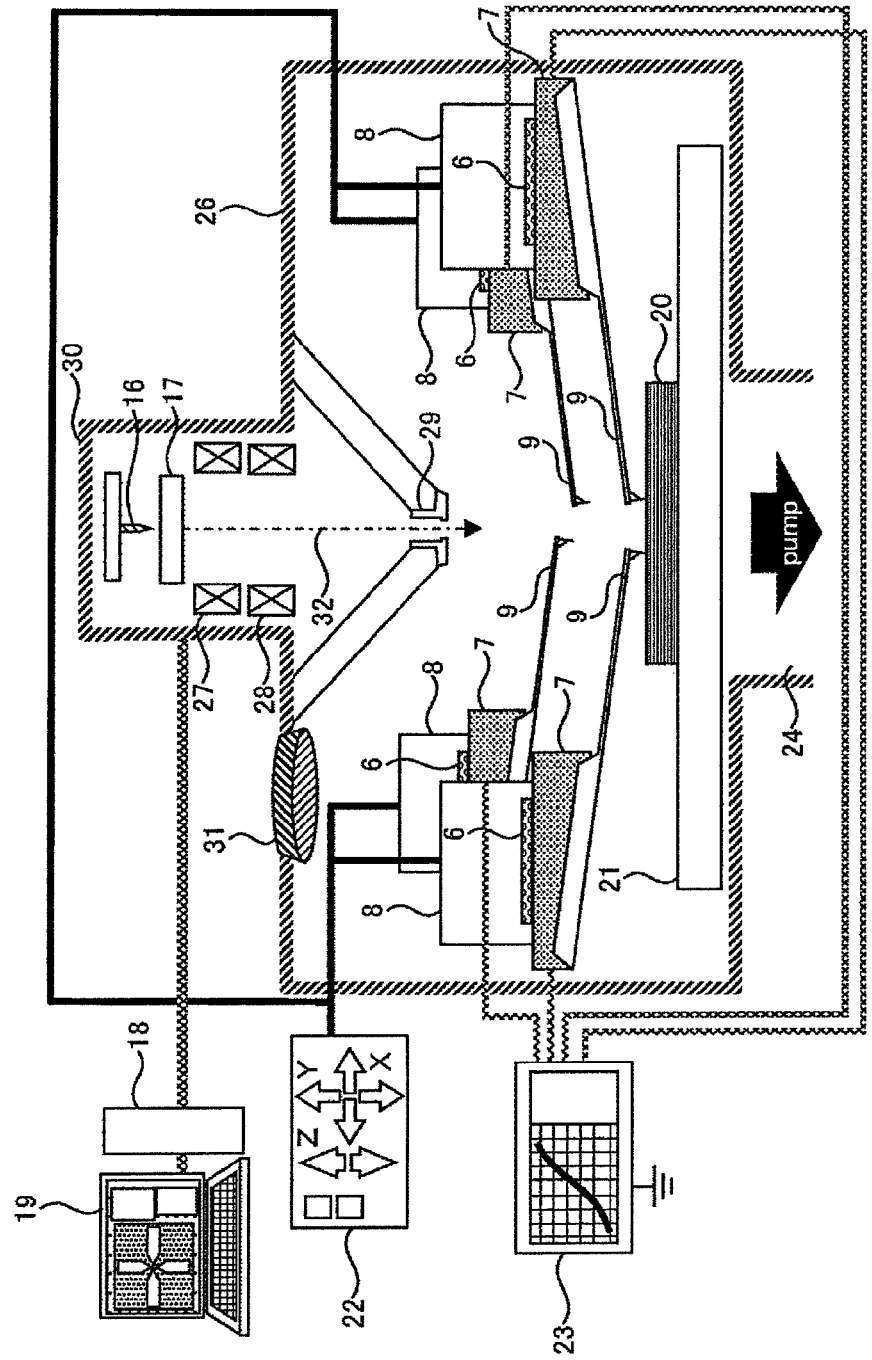
FIG. 8 is a schematic view showing an outline of a micro contact type prober in accordance with the first embodiment of the present invention.

FIG. 8 is a schematic view of a micro contact type prober using the conductive nano pillar exploratory needle 1 in accordance with the present invention. The micro contact type probe in accordance with the first embodiment is constructed by a body tube 30 which includes an electron source 16, a convergent electron lens 17, a scanning coil 27, a focusing coil 28 and objective lens 29, four or more probes 9 which are connected to a fine adjustment and coarse adjustment scanner 8, a stage 21 which mounts a measurement sample 20, a secondary electron detector 31, and an exhaust apparatus 24, in the casing 26.

It is possible to mainly evaluate a semiconductor device as the sample. Four probes 9 are used for bringing into contact with a source, a gate, a drain and a semiconductor substrate. A semiconductor parameter analyzer 23 is installed between the probes for applying an electric voltage between the exploratory needles.

Further, a current application to the scanning coil 27 and the focusing coil 28 can be controlled by an electron microscope control computer 18, and an irradiating position and a focusing position of the electron beam 32 can be set by a computer 157. In this case, the electron source 16 for irradiating the electron beam 32 employs a field emission type electron gun which can make a diameter small even by a low accelerating voltage. As mentioned above, since it is possible to control the irradiating position of the electron beam 32 by the computer, it is possible to make the electron beam 32 scan on the measurement sample. Further, since the secondary and reflection electron detector is installed, it is possible to detect an intensity of the secondary electron and reflection electron generated from the measurement sample 20 in correspondence to the scanning position of the electron beam 32. In other words, a function of a scanning electron microscope (SEM) is provided.

Since the micro contact type prober has the SEM function, it is possible to easily check a shape of the nano pillar exploratory needle 1 in a leading end of the probe 9 and a position in a horizontal direction thereof, in addition to a shape of a surface of the measurement sample 20. Further, since it is possible to evaluate a difference of the focusing position by respectively focusing on the measurement sample 20 and the probe 9, it is possible to check a height of the probe 9 with respect to the measurement sample 20.

On the other hand, in the micro contact type prober, there is employed the coarse adjustment and fine adjustment scanner having both the coarse adjustment and the fine adjustment for the movement of the probe 9. Particularly, since the fine adjustment is constructed so as to include the piezoelectric element, it is possible to move a position of the leading end of the nano pillar exploratory needle 1 in accordance with a precision equal to or less than 1 nm In accordance with this, it is possible to bring the leading end of the nano pillar exploratory needle 1 into contact with a specific position on the measurement sample 20 by combining with the SEM function.

Figure 13:
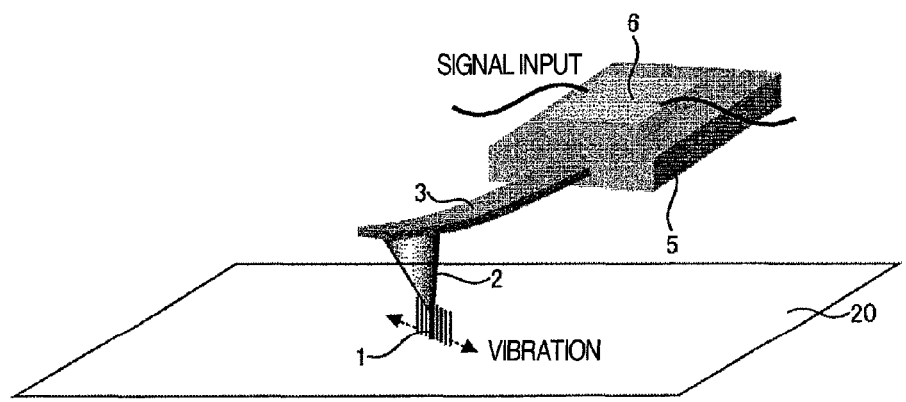
FIG. 13 is a schematic view showing a vibrating direction of the probe in accordance with the first embodiment of the present invention.
Figure 14:
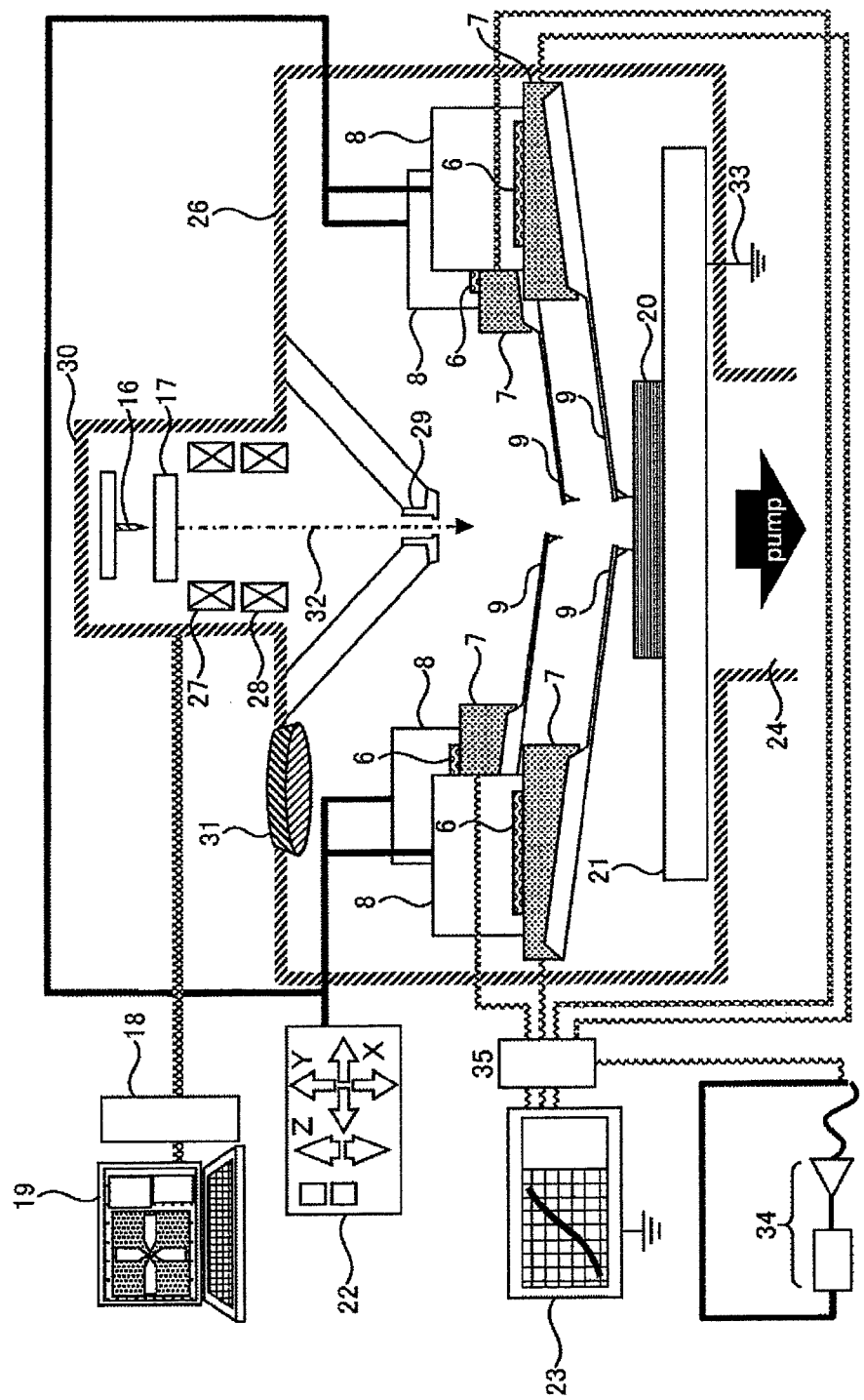
FIG. 14 is a schematic view showing an outline of a micro contact type prober in accordance with an eighth embodiment of the present invention.

Since the probe 9 in accordance with the present embodiment is of the cantilever type, it is possible to achieve an exploratory needle contact utilizing a mechanical characteristic of the cantilever 3. It is possible to prevent an excessive load from being applied to the nano pillar exploratory needle by deflecting at a time of the contact with the exploratory needle. The nano pillar exploratory needle 1 is installed approximately vertically with respect to the surface of the measurement sample 20, whereby a compressive load in a direction of a longitudinal axis is applied at a time of the contact, so that it is possible to secure a maximum bending strength of the exploratory needle. Further, as shown in FIG. 13, it is possible to remove a layer which disturbs the electric contact such as the contamination or the like on the surface, by exciting the cantilever 3 in a horizontal direction to the sample surface, by means of a vibration applying piezo 6 which is installed in a probe holder 7. Further, on the basis of a repeat of the friction of the contact interface of the nano pillar exploratory needle 1 and the compression exposed to the material itself by applying an ultrasonic vibration, an inner portion thereof generates heat and rises its temperature, and the surface of the measurement sample 20 can be soften and molten by an impact force of the ultrasonic so as to be deposited. At this time, the frequency vibrating the cantilever 3 is between 100 and 100 MHz, and a vibration amplitude employs 1 to 100 nm. As a result, a good electric contact can be achieved between the measurement sample 20 and the nano pillar exploratory needle 1.

(Second Embodiment)

Figure 2:
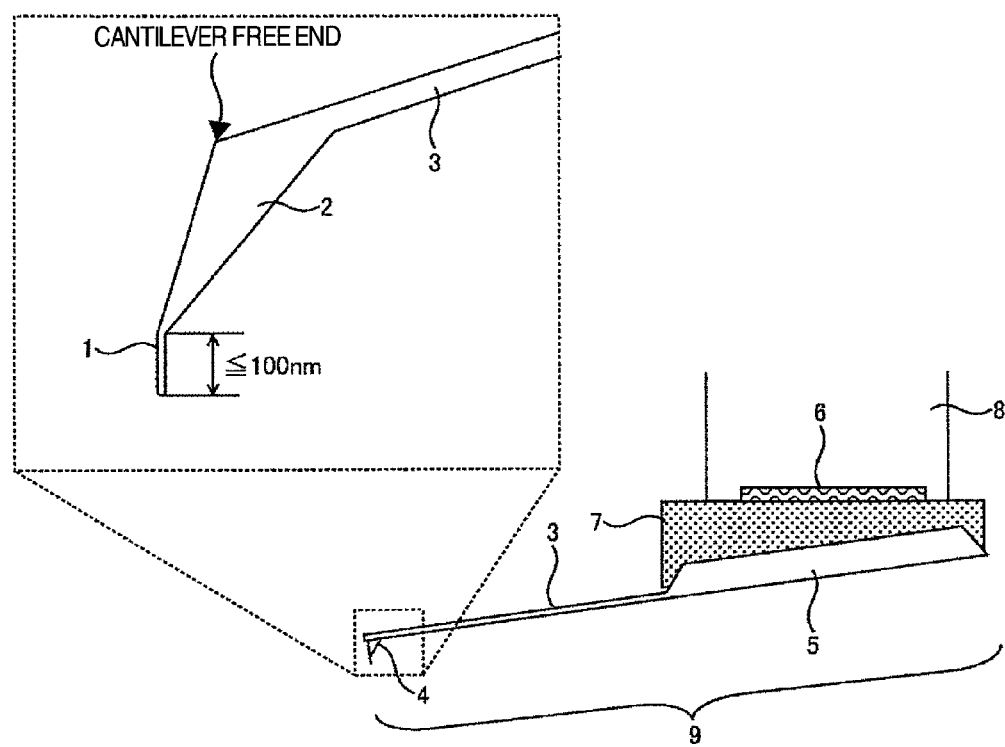
FIG. 2 is a schematic view showing an outline of a probe in accordance with a second embodiment of the present invention.

FIG. 2 is a schematic view showing an outline of a probe 9 in a micro contact type prober in accordance with a second embodiment of the present invention. The probe 9 in accordance with the present invention is constructed by a holder 2 in which a leading end portion protrudes more than a free end of a cantilever 3 in a leading end of the cantilever 3 protruding out of a substrate 5, and an acuminated nano pillar exploratory needle 1 which protrudes out of the holder 2 at a length between 50 and 100 nm.

As much as the same material and shape as the embodiment 1, it is possible to bring the exploratory needle into contact with the measurement sample 20 without bringing the probes 9 into contact with each other, by making the leading end of the holder 2 protrude more than the free end of the cantilever 3, on the basis of an application to the micro contact type prober which is provided with the SEM mechanism shown in FIG. 8. In accordance with this, it is possible to evaluate an electric conduction characteristic of nano scale, by measuring an electric current flowing between the probes 9 at a distance of several tens nm.

(Third Embodiment)

Figure 3:
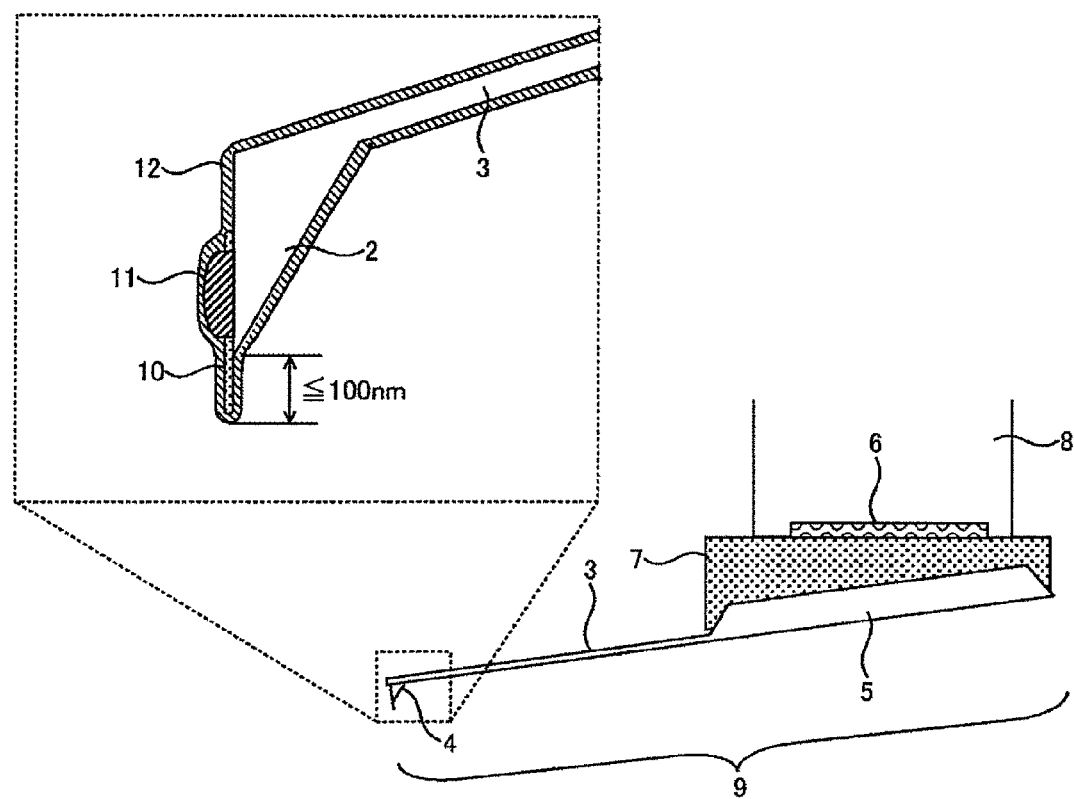
FIG. 3 is a schematic view showing an outline of a probe in accordance with a third embodiment of the present invention.

FIG. 3 is a schematic view showing an outline of a probe 9 in a micro contact type prober in accordance with a third embodiment of the present invention. The probe 9 in accordance with the present invention is constructed by a holder 2 which is attached to a leading end of a cantilever 3 protruding out of a substrate 5, and a carbon nano tube 10 which is protruded out of the holder 2 at a length between 50 and 100 nm, is fixed by a metal fixing film 11 and has a diameter between 10 and 20 nm, and a surface thereof is coated with a metal film 12.

The substrate 5, the cantilever 3 and the holder 2 employ a conductive raw material such as Si, SiN or tungsten obtained by coating a conductive film in the same manner as the embodiment, and the cantilever 3 uses a structure in which a spring constant is in a range between 0.1 and 100 N/m.

Further, the carbon nano tube 10 is fixed by decomposing a metal gas by an irradiation of a charged particle beam and piling up the conductive metal like a sheet in a state of being supported by the holder 2. As a precursor gas used at this time, there are, for example, $W(CO)_6$, $WF_6$, $Me_2Au(tfc)$, $Co_2(CO)_8$, $Cr(C_6H_6)_2$, hfac-Cu-TMVS, $Fe(CO)_5$, $Mo(CO)_6$, $Ni(CO)_4$, $Os_3(CO)_{12}$, $Pd(OOCCH_3)_2$, $Pt(PF_3)_4$ and the like. In order to secure a conductivity, noble metals such as a gold, a platinum, a palladium and the like are preferable, however, it is not particularly limited. In the EBID method, it is possible to form a metal fixing film by narrowing down a spot size to 10 nanometer or less and surface irradiating an electron beam 32 at an angle of 100 nm in a range of a sample current value between 100 pA and 5000 pA.

The carbon nano tube 10 in the present embodiment is cut by using a pulse current for regulating a length to a length between 50 and 100 nm. It is desirable to cut by a current application for regulating the length of the nano tube. It can be achieved, for example, by approximating or bringing the leading end portion of the nano tube which is fixed to the holder 2, to or into contact with an electrode which is prepared at a position of a counter electrode of an electrode in a leading end portion of another carbon nano tube 10 which is supported by the electrode, applying an electric voltage in accordance with a pulse or a condenser electric discharge between the exploratory needle holder and the electrode so as to circulate an electric current, cutting the nano tube by the contact portion, and repeatedly carrying out this cutting. A method of applying the electric current is not limited, but particularly in a method of cutting by circulating and applying a pulse voltage and current having a rapid rising edge, it is possible to fine adjust the length of the nano tube at a precision of about 10 nm to the minimum, by repeating the cutting at a plurality of times, and it is possible to finally adjust the length to 50 to 100 nm.

As the other method of forming the shape in which the exploratory needle having the uniform diameter protrudes out of the end surface of the exploratory needle holder in accordance with the present invention, it is possible to solve by making the nano tube grow more than a metal catalyst installed in the end surface of the exploratory needle holder in accordance with a CVD, or embedding the nano tube in a metal having a low melting point.

The metal film 12 can employ a sputter, a resistance heating deposition, or an electron beam deposition. It is necessary to select a material obtained by taking into consideration an adhesion with the carbon nano tube 10, and it is possible to form a film having a good adhesion by coating by three layers of Ti/Pt/Au or two layers of Ti/Pt.

Since the micro contact type prober shown in FIG. 8 in the present embodiment can utilize a tough mechanism characteristic similar to a diamond in the carbon nano tube 10, it is possible to prevent a breakage and a wear at a time of coming into contact with the sample.

FIG. 10 shows a SEM photograph of the probe 9 in accordance with the present embodiment, and a load and an electric current value at a time of measuring a force curve using it. In accordance with this measurement, it is confirmed that the electric current value becomes maximum, that is, the contact resistance becomes minimum in the load of about 200 nN before a buckling of the carbon nano tube 10.

Figure 11:
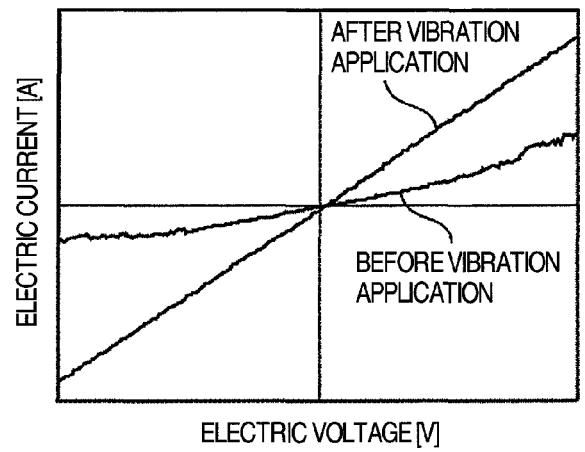
FIG. 11 is a graph showing an electric current and electric voltage characteristic before and after vibration of the probe using the carbon nano tube in accordance with the present invention.

Further, FIG. 11 shows a volt-ampere characteristic which is measured after bringing the probe 9 into contact with the measurement sample 20, and a volt-ampere characteristic which is measured after exciting the cantilever 3 under a condition of 100 Hz and 1000 times after bringing the carbon nano tube 10 into contact by the load of 200 nN. Since a great electric current flows after the excitation, a reduction of the contact resistance by the excitation is confirmed.

By using the carbon nano tube 10, the aspect of the exploratory needle does not collapse by mechanically reducing the contact resistance while using the force curve measurement and the excitation of the cantilever 3, and it is possible to elongate a service life of the probe 9.

(Fourth Embodiment)

Figure 4:
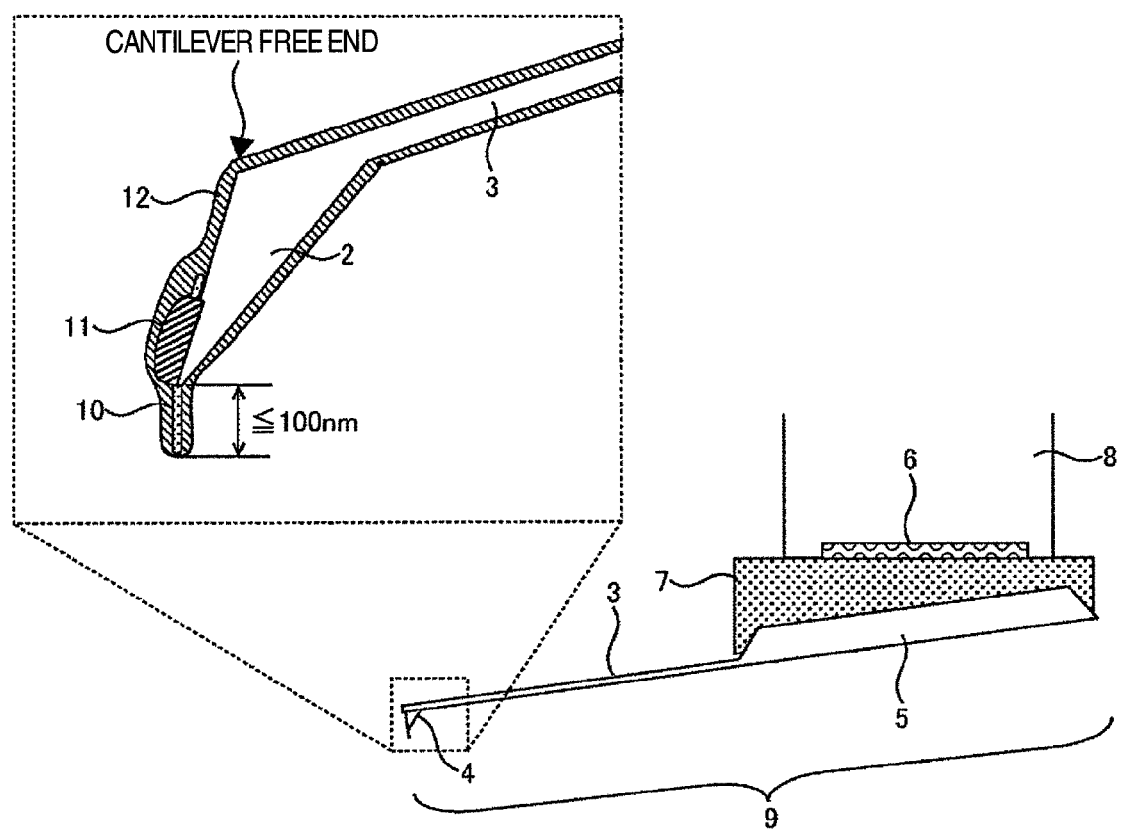
FIG. 4 is a schematic view showing an outline of a probe in accordance with a fourth embodiment of the present invention.

FIG. 4 is a schematic view showing an outline of a probe 9 in a micro contact type prober in accordance with a fourth embodiment of the present invention. The probe 9 in accordance with the present invention is constructed by a holder 2 in which a leading end portion protrudes more than a free end of a cantilever 3 in a leading end of the cantilever 3 protruding out of a substrate 5, and a carbon nano tube 10 which is protruded out of the holder 2 at a length between 50 and 100 nm, is fixed by a metal fixing film 11 and has a diameter between 10 and 20 nm, and a surface thereof is coated with a metal film 12.

As much as the same material and shape as the embodiment 3, it is possible to bring the exploratory needle into contact with the measurement sample 20 without bringing the probes 9 into contact with each other, by making the leading end of the holder 2 protrude more than the free end of the cantilever 3, on the basis of an application to the micro contact type prober which is provided with the SEM mechanism shown in FIG. 8. In accordance with this, it is possible to evaluate an electric conduction characteristic of nano scale, by measuring an electric current flowing between the probes 9 at a distance of several tens nm between the probes.

(Fifth Embodiment)

Figure 5:
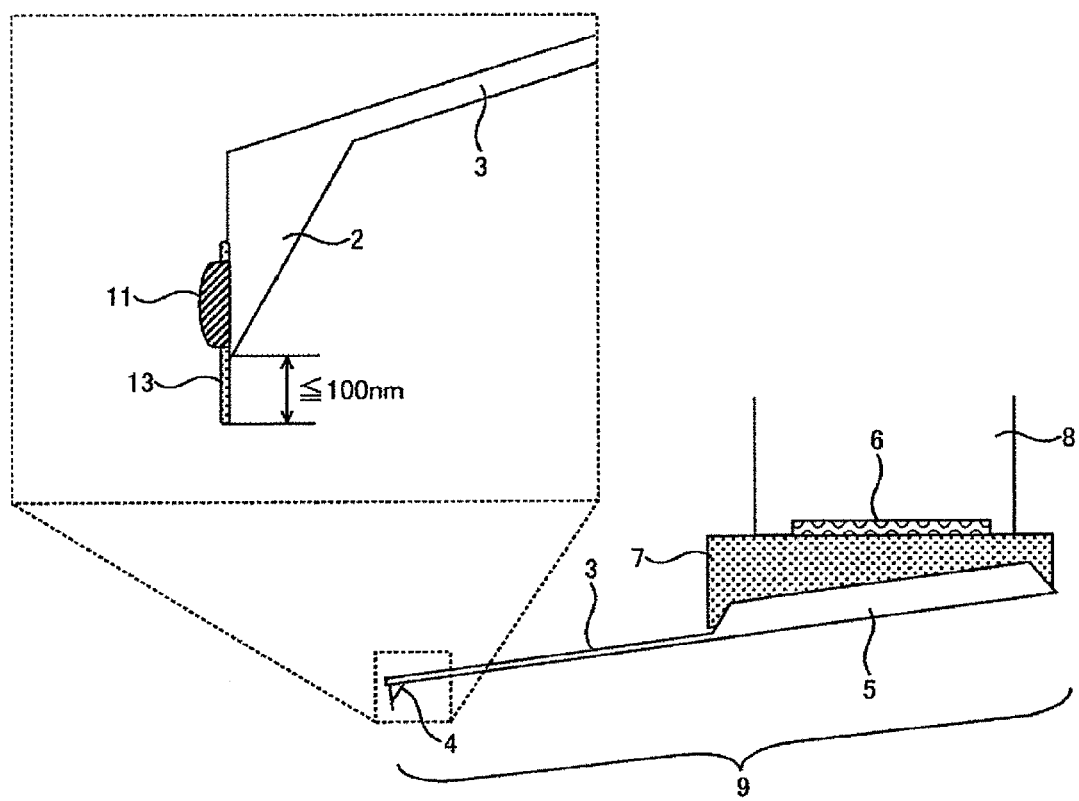
FIG. 5 is a schematic view showing an outline of a probe in accordance with a fifth embodiment of the present invention.

FIG. 5 is a schematic view showing an outline of a probe 9 in a micro contact type prober in accordance with a fifth embodiment of the present invention. The probe 9 in accordance with the present invention is constructed by a holder 2 which is attached to a leading end of a cantilever 3 protruding out of a substrate 5, and a metal nano wire 13 which is protruded out of the holder 2 at a length between 50 and 100 nm, and is fixed by a metal fixing film 11.

The substrate 5, the cantilever 3 and the holder 2 employ a conductive raw material such as Si, SiN or tungsten obtained by coating a conductive film in the same manner as the embodiment, and the cantilever 3 uses a structure in which a spring constant is in a range between 0.1 and 100 N/m.

Further, the metal nano wire 13 is fixed by decomposing a metal gas by an irradiation of a charged particle beam and piling up the conductive metal like a sheet in a state of being supported by the holder 2. As a precursor gas used at this time, there are, for example, $W(CO)_6$, $WF_6$, $Me_2Au(tfc)$, $Co_2(CO)_8$, $Cr(C_6H_6)_2$, hfac-Cu-TMVS, $Fe(CO)_5$, $Mo(CO)_6$, $Ni(CO)_4$, $Os_3(CO)_{12}$, $Pd(OOCCH_3)_2$, $Pt(PF_3)_4$ and the like. In order to secure a conductivity, noble metals such as a gold, a platinum, a palladium and the like are preferable, however, it is not particularly limited. In the EBID method, it is possible to form a metal fixing film by narrowing down a spot size to 10 nanometer or less and surface irradiating an electron beam 32 at an angle of 100 nm in a range of a sample current value between 100 pA and 5000 pA.

The metal nano wire 13 in the present embodiment is cut by using a pulse current for regulating a length to a length between 50 and 100 nm, in the same manner as the carbon nano tube 10.

Since the micro contact type prober as shown in FIG. 8 in the present embodiment has the high purity metal in the leading end of the probe 9, it is possible to be deposited by applying the ultrasonic vibration at a time of the sample contact.

(Sixth Embodiment)

Figure 6:
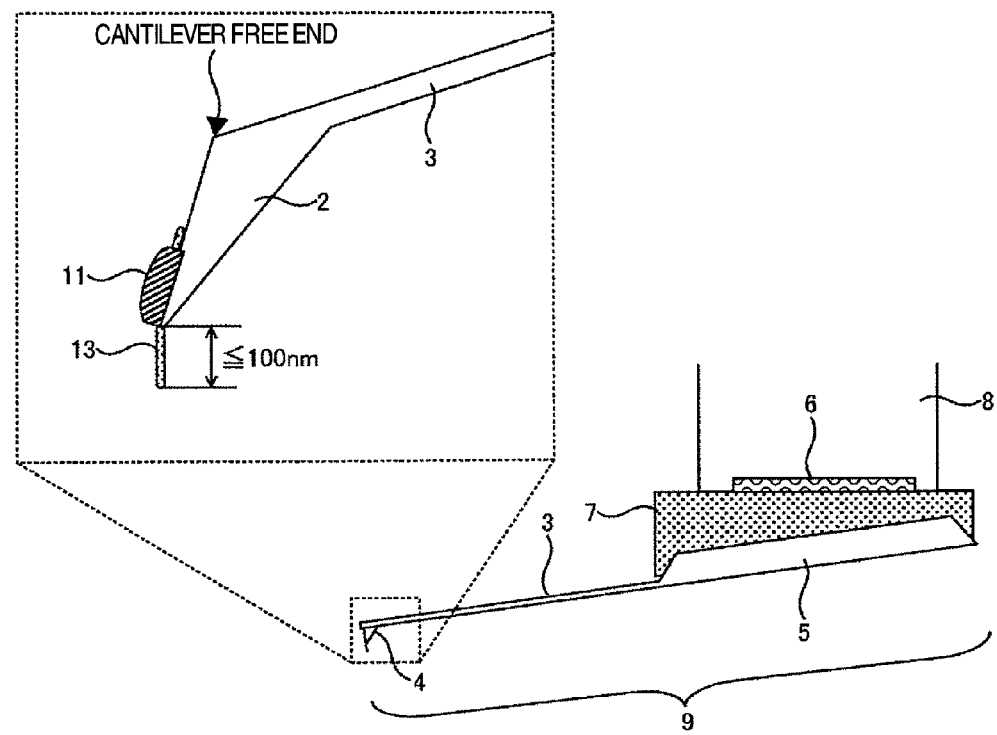
FIG. 6 is a schematic view showing an outline of a probe in accordance with a sixth embodiment of the present invention.

FIG. 6 is a schematic view showing an outline of a probe 9 in a micro contact type prober in accordance with a sixth embodiment of the present invention. The probe 9 in accordance with the present invention is constructed by a holder 2 in which a leading end portion protrudes more than a free end of a cantilever 3 protruding out of a substrate 5, and a metal nano wire 13 which is protruded out of the holder 2 at a length between 50 and 100 nm, and is fixed by a metal fixing film 11.

As much as the same material and shape as the embodiment 5, it is possible to bring the exploratory needle into contact with the measurement sample 20 without bringing the probes 9 into contact with each other, by making the leading end of the holder 2 protrude more than the free end of the cantilever 3, on the basis of an application to the micro contact type prober which is provided with the SEM mechanism shown in FIG. 8. In accordance with this, it is possible to evaluate an electric conduction characteristic of nano scale, by measuring an electric current flowing between the probes 9 at a distance of several tens nm between the probes 9.

(Seventh Embodiment)

Figure 7:
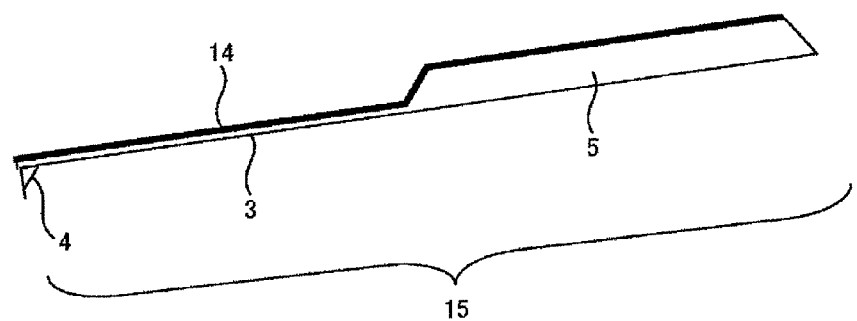
FIG. 7 is a schematic view showing an outline of a contact detection type probe in accordance with a seventh embodiment of the present invention.

FIG. 7 is a schematic view showing an outline of a contact diction type probe 15 in a micro contact type prober in accordance with a seventh embodiment of the present invention. The contact detection type probe 15 in accordance with the present invention is constructed by a chip 4 which is installed in a leading end of a cantilever 3 protruding out of a substrate 5, and a piezoelectric element 14 which is coated on one surface of the cantilever 3 and the substrate 5. The chip 4 can utilize the holder 2 and the exploratory needle in accordance with any one of the embodiments 1 to 6.

Figure 9:
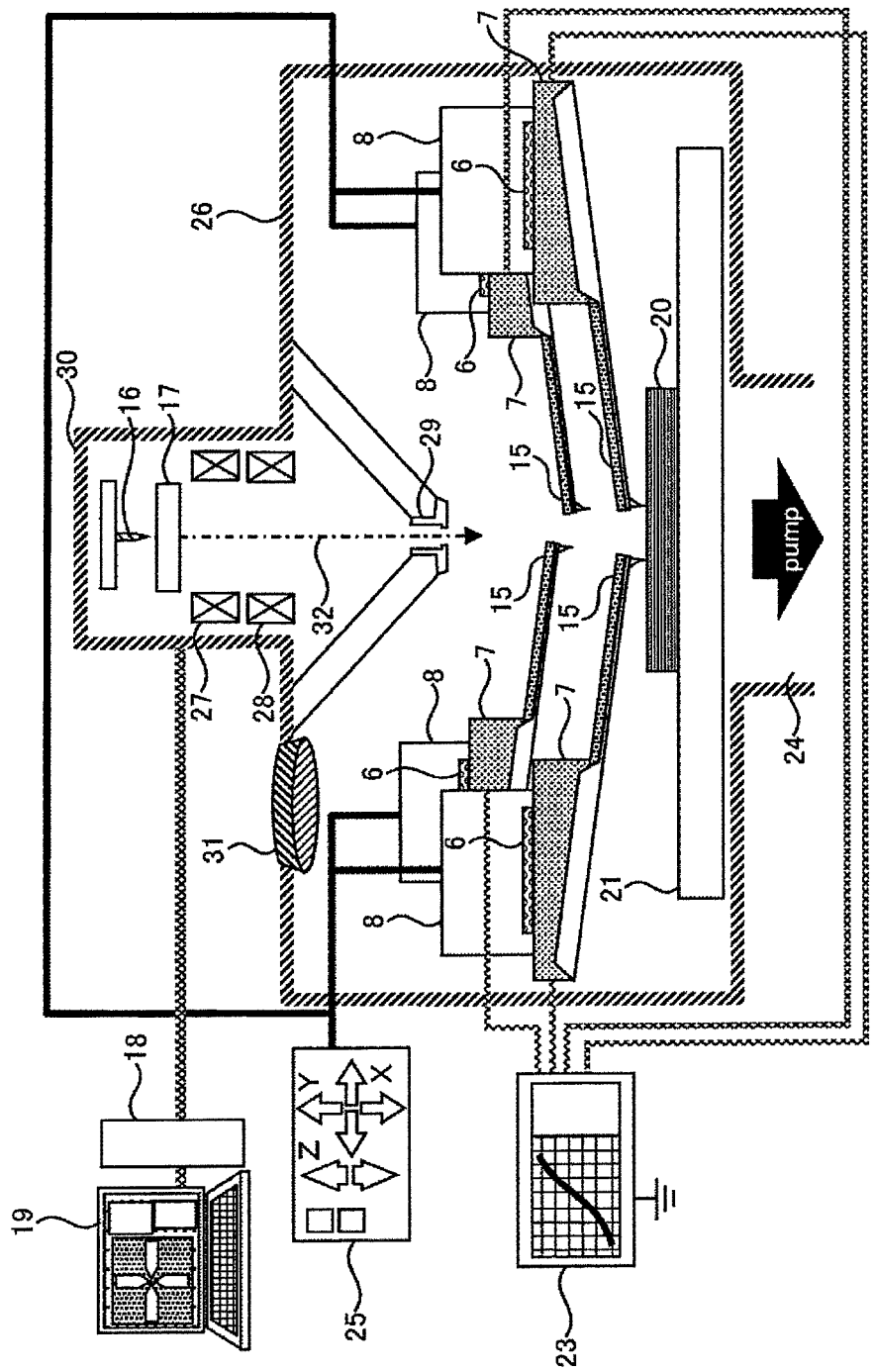
FIG. 9 is a schematic view showing an outline of a micro contact type prober in accordance with the seventh embodiment of the present invention.

FIG. 9 is a schematic view of the micro contact type prober in accordance with the present invention. The micro contact type probe in accordance with the seventh embodiment has the SEM mechanism in the same manner as the embodiments 1 to 6, however, is different in a point that a contact detection type probe special controller 25 for exclusive use is installed since the contact detection type probe is applied.

It is possible to detect a contact between a leading end of the chip 4 and a measurement sample 20 on the basis of an electric signal which is generated from a deflection of the cantilever 3, and it is possible to easily regulate a contact stress, by using the contact detection type probe 15 in accordance with the present embodiment.

(Eighth Embodiment)

FIG. 13 is a schematic view showing an outline of a micro contact type prober in accordance with an eighth embodiment of the present invention. The micro contact type prober in accordance with the present invention has the SEM mechanism in the same manner as the embodiments 1 to 6, however, is different in a point that a stage earth connection 33, a tunnel current feedback control mechanism 34, and a changeover switch 35 with respect to a semiconductor parameter analyzer 23 are installed, since a contact detection between an exploratory needle and a measurement sample by a tunnel current is applied.

It is possible to detect the contact between the leading end of the chip 4 and the measurement sample 20 on the basis of the tunnel current, and it is possible to easily regulate an approach of the exploratory needle, by using the contact detection type probe 15 in accordance with the present embodiment.

(Ninth Embodiment)

Figure 15:
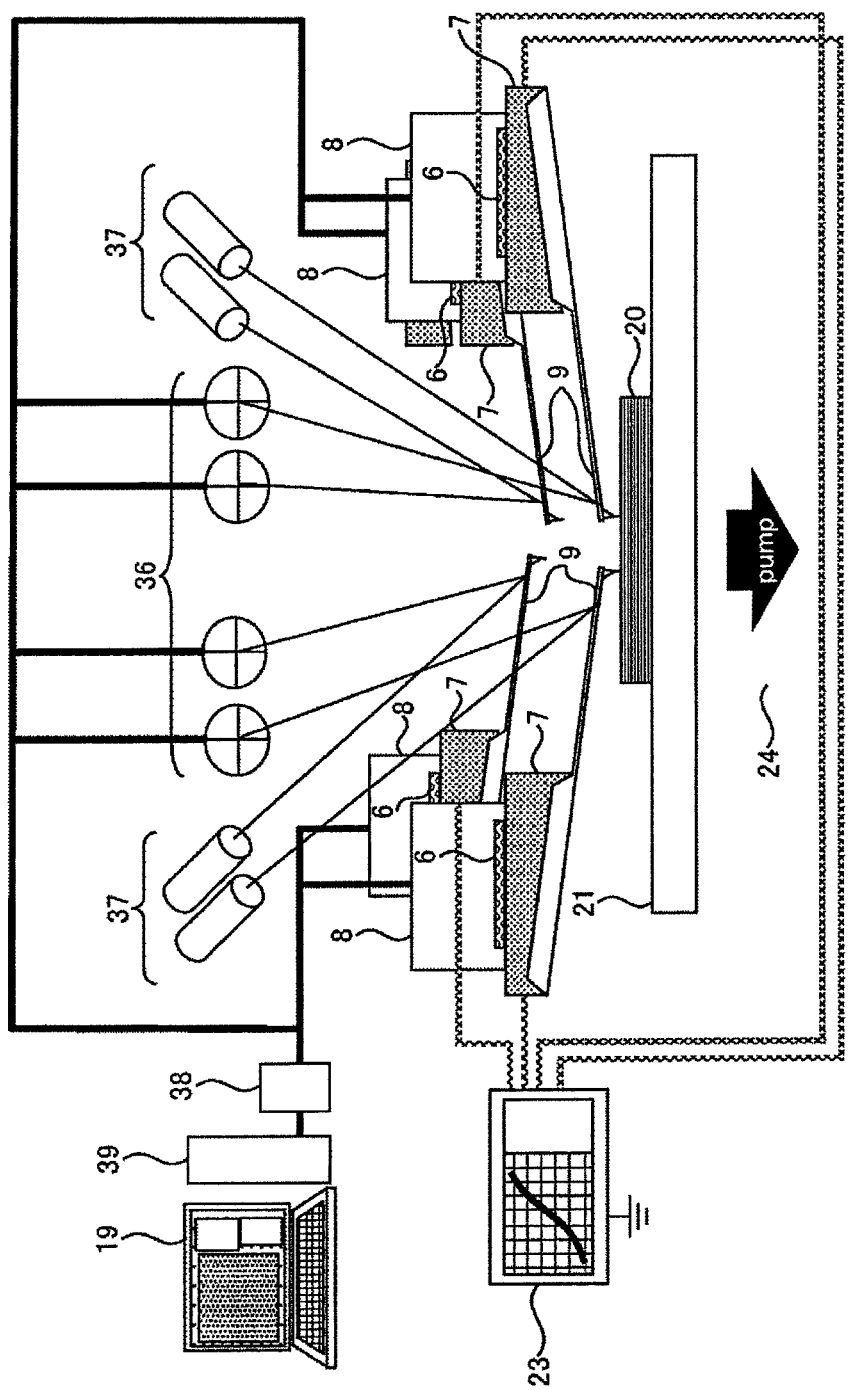
FIG. 15 is a schematic view showing an outline of a micro contact type prober in accordance with a ninth embodiment of the present invention.

FIG. 15 is a schematic view showing an outline of a micro contact type prober in accordance with a ninth embodiment of the present invention. The micro contact type prober in accordance with the present invention does not have the SEM mechanism in the same manner as the embodiments 1 to 8, and is different in a point that a photo detector 36, a semiconductor laser 37, an AFM feedback control circuit 38 and an AFM control computer 39 are installed, since a contact detection between an exploratory needle and a measurement sample by an optical lever is applied.

It is possible to detect the contact between the leading end of the chip 4 and the measurement sample 20 on the basis of a spring warp of the cantilever by using the contact detection type probe 15 in accordance with the present embodiment, and it is possible to prevent the contamination by the electron beam of the SEM from being attached, by acquiring an AFM image in a measurement region, whereby it is possible to reduce the contact resistance.

COMPARATIVE EXAMPLE 1

Figure 12:
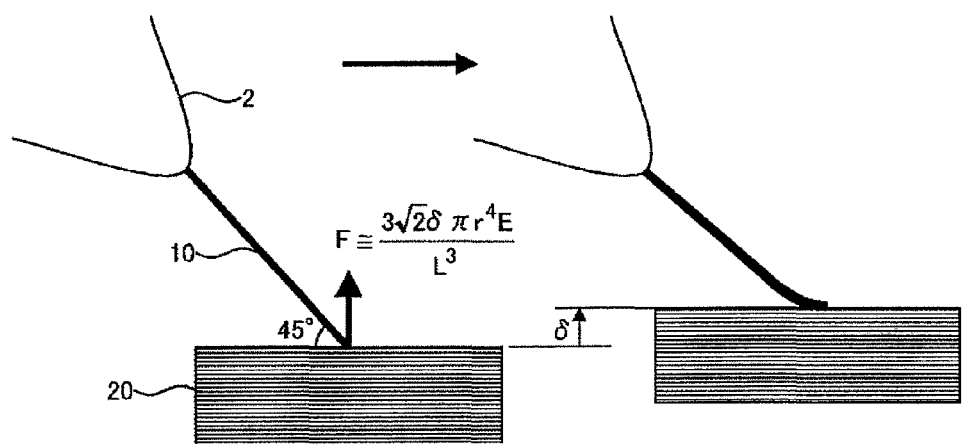
FIG. 12 is a schematic view showing a comparative example.

FIG. 12 shows a comparative example. A micro contact type prober of a conventional type is constructed only by a metal exploratory needle. In accordance with this, it is impossible to stand up to the load at a time of the contact as a radius of curvature of the leading end of the exploratory needle becomes smaller, and the leading end portion of the exploratory needle folds down or wears off by several times of probing. Accordingly, the exploratory needle which is high in both of the rigidity and the elasticity such as the carbon nano tube 10 is applied to the prober. However, in the case that an SEM observing direction is vertical to the sample, an approach of the probe 9 to the sample can not be achieved from the vertical direction, but has an inclination at 45 degree. Therefore, the carbon nano tube 10 yields by a force of about several nN in a moment when it comes into contact with the sample. In other words, since the contact stress is small, the contact resistance remains in being high.

DESCRIPTION OF REFERENCE NUMERALS 1 nano pillar exploratory needle
2 holder
3 cantilever
4 chip
5 substrate
6 vibration applying piezo
7 probe holder
8 fine adjustment and coarse adjustment scanner
9 probe
10 carbon nano tube
11 metal fixing film
12 metal film
13 metal nano wire
14 piezoelectric element
15 contact detection type probe
16 electron source
17 convergent electron lens
18 electron microscope control computer
19 monitor
20 measurement sample
21 stage
22 probe special controller
23 semiconductor parameter analyzer
24 exhaust apparatus
25 contact detection type probe special controller
26 casing
27 scanning coil
28 focusing coil
29 objective lens
30 body tube
31 secondary electron detector
32 electron beam
33 stage each connection
34 tunnel current feedback control mechanism
35 changeover switch
36 photo detector
37 semiconductor laser
38 AFM feedback control circuit
39 AFM control computer

The invention claimed is:

1. A micro contact type prober applying an electric signal between a plurality of probes while observing within an electron microscope and evaluating an electric physical property of a subject to be inspected,
   wherein said prober has cantilevers, and
   wherein said cantilevers comprises:
   an exploratory needle protruding out of a holder installed in a leading end;
   a vibration applying mechanism vibrating each of the cantilevers in a horizontal direction with respect to the subject to be inspected;
   a signal generating apparatus driving said vibration applying mechanism;
   a voltage source applying a desired voltage between the cantilevers; and
   an ampere meter measuring an electric current flowing between the probes to which the desired voltage is applied by said voltage source.

2. A micro contact type prober as claimed in claim 1, wherein said exploratory needle is constructed by a metal or a nano wire or a nano pillar including the metal which protrudes out of said holder at a length between 50 and 100 nm.

3. A micro contact type prober as claimed in claim 1, wherein said exploratory needle is constructed by a carbon nano tube which protrudes out of said holder at a length between 50 and 100 nm and is coated with a metal.

4. A micro contact type prober as claimed in claim 1, wherein a leading end portion of said holder protrudes more than a free end of said cantilever, and leading ends of said holder and said exploratory needle are checked from an upper portion of the cantilever.

5. A micro contact type prober as claimed in claim 1, wherein said cantilever is constructed by a conductive cantilever which is made of a metal or a metal coated silicon.

6. A micro contact type prober as claimed in claim 1, wherein said cantilever is provided with a piezoelectric element, and an amount of deflection of the cantilever is detected on the basis of an electric signal of said piezoelectric element.

7. A micro contact type prober as claimed in claim 1, wherein said prober is provided with a feedback mechanism of a tunnel current, and a contact between the exploratory needle and a measurement sample is detected by the tunnel current.

* * * * *